United States Patent
Sadakata et al.

(10) Patent No.: US 6,909,624 B2
(45) Date of Patent: Jun. 21, 2005

(54) SEMICONDUCTOR MEMORY DEVICE AND TEST METHOD THEREOF

(75) Inventors: Hiroyuki Sadakata, Osaka (JP); Naoki Kuroda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 141 days.

(21) Appl. No.: 10/624,890

(22) Filed: Jul. 23, 2003

(65) Prior Publication Data

US 2004/0125667 A1 Jul. 1, 2004

(30) Foreign Application Priority Data

Aug. 5, 2002 (JP) .................................. 2002-227058

(51) Int. Cl.[7] .................................................. G11C 5/06
(52) U.S. Cl. ...................... 365/63; 365/201; 365/230.03
(58) Field of Search ....................... 365/63, 201, 230.03

(56) References Cited

U.S. PATENT DOCUMENTS

| | | | | |
|---|---|---|---|---|
| 4,654,787 A | * | 3/1987 | Finnell et al. ............... 711/172 |
| 4,734,884 A | * | 3/1988 | Kohno et al. ................. 365/1 |
| 5,222,066 A | * | 6/1993 | Grula et al. ................. 714/718 |
| 5,237,672 A | * | 8/1993 | Ing-Simmons et al. ....... 711/211 |
| 5,436,910 A | | 7/1995 | Takeshima et al. |
| 5,517,253 A | * | 5/1996 | De Lange .................... 348/513 |
| 5,930,814 A | * | 7/1999 | Lepejian et al. ............... 711/1 |
| 6,343,378 B1 | * | 1/2002 | Moroda ....................... 717/162 |
| 6,360,342 B1 | * | 3/2002 | Lee et al. ................... 714/718 |
| 6,662,285 B1 | * | 12/2003 | Douglass et al. ........... 717/167 |
| 6,714,903 B1 | * | 3/2004 | Chu et al. ..................... 703/19 |

* cited by examiner

Primary Examiner—M. Tran
(74) Attorney, Agent, or Firm—Stevens, Davis, Miller & Mosher, LLP

(57) ABSTRACT

In recent system LSIs, a plurality of RAMs differing in capacity and in bit width have come to be mounted on a single chip according to the needs on the system side. However, when testing the plurality of RAMs, if the RAMs differ in capacity, they cannot be tested using the same test pattern (for example, HALF-MARCH) even if a special pin is provided for each RAM, because X, Y address mapping differs between the different RAMs; accordingly, the test has to be performed by dividing the RAMs into groups each consisting of RAMs having the same memory space, and this has lead to increased test time. An external address signal and a test-only address signal are provided as RAM control signals and, in the latter case, the number of X, Y addresses in each of the RAMs 4 and 5 is set equal to that of the largest capacity RAM 3 within the same chip, thereby making the X, Y address mapping the same for all the RAMs 3 to 5.

13 Claims, 9 Drawing Sheets

SEMICONDUCTOR MEMORY DEVICE AND TEST METHOD THEREOF

BACKGROUND OF THE INVENTION

1. Field of the Invention

The present invention relates to a semiconductor memory device having a plurality of RAMs of differing memory spaces on the same substrate, for example, on the same silicon, and a method for testing the same, and more particularly to a circuit configuration that makes parallel testing possible.

2. Description of the Related Art

In recent system LSIs, a plurality of RAMs have come to be mounted on the same silicon according to the needs on the system side; for example, a plurality of RAMs differing in capacity and in bit width have been accommodated on a single chip. One of the major problems involved in the production of such a system LSI having a plurality of RAMs mounted thereon is that the time required to test the RAMs becomes long.

In particular, in the case of RAMs designed to such specifications that provide for a common test I/O bus, common address, and common control signal and that control access to each RAM by a chip select signal, the only test method usually available has been the serial test method that carries out a test on a RAM by RAM basis; in this case, the total test time increases as the number of RAMs mounted increases.

If the test time is to be reduced here, an environment where parallel testing can be performed using testers can be provided for RAMs having the same memory space by providing an I/O bus, address, and control signal special for each individual RAM. In this way, the test time can be reduced and the productivity can thus be increased.

However, for RAMs having different memory spaces, parallel testing of the RAMs cannot be done. The reason is that, in the method of using a memory tester commonly practiced today, X and Y addresses are assigned in the row and column directions of a memory in order to access the memory space, and a test pattern is generated. As a result, in the case of RAMs having different memory spaces, since the memory row/column organization differs between the different RAMs, the same X and Y addresses cannot be assigned, and therefore, the test cannot be performed using the same test pattern (for example, HALF-MARCH).

Accordingly, in the case where a plurality of RAMs are mounted and some of the RAMs have different memory spaces, the RAMs have to be divided into groups each consisting of RAMs having the same memory space, and parallel testing has to be done on a group by group basis; this has lead to the problem of increased test time.

SUMMARY OF THE INVENTION

The present invention has bee devised to solve the above problem associated with the prior art, and an object of the invention is to provide a semiconductor memory device and a method for testing the same, wherein even when a plurality of RAMs having different memory spaces are mounted on the same silicon, all the RAMs can be tested simultaneously in parallel fashion.

A semiconductor memory device according to the present invention comprises: a plurality of RAMs of differing memory spaces on the same substrate; and means for setting the number of address signals in each of the RAMs equal to the number of address signals in the largest address space.

According to the above configuration of the present invention, when simultaneously testing memories of differing memory spaces, for example, on the same silicon, each memory being a RAM using, for example, a non-multiplexed addressing scheme, since provision is made to set the number of external input addresses equal to the number of address inputs in the largest address space, the RAMs can be tested in parallel fashion using the same test pattern because, even in the case of address non-multiplexed RAMs, the row/column organization can be made the same between the different memory spaces by assigning the rows and columns of the largest address space to all the memories on the same silicon, and by mapping any address actually not used into a virtual memory space.

As described above, by making the row/column address mapping the same between the RAMs having different capacities, parallel testing can be done even on the RAMs having different capacities; this greatly contributes to reducing the test time.

The present invention also provides a semiconductor memory device comprising: a plurality of RAMs of differing memory spaces on the same substrate; and means for setting the number of address signals in each of the RAMs equal to the number of address signals in the largest address space when mapping the address space for test purposes differently from the mapping of the address space for normal operation.

The present invention further provides a semiconductor memory device comprising: a plurality of RAMs of differing memory spaces provided on the same substrate; and means capable of changing an address connection between an external input address and a chip internal input address according to the differing memory spaces, wherein the means enables the number of address signals in each of the RAMs to be set equal to the number of address signals in the largest address space.

According to the above configuration, with the provision of the means capable of changing the address connection between an external input address and a chip internal input address according to the differing memory spaces, it becomes possible to change the connection between a control external input address and an internal input address, making it easier to change the row/column mapping in the address space.

In the above configuration, the means capable of changing an address connection between an external input address and a chip internal input address is placed before a position at which an external input address signal is converted to an internal address signal.

Alternatively, in the above configuration, the means capable of changing an address connection between an external input address and a chip internal input address is placed after a position at which an external input address signal is converted to an internal address signal.

In the above configuration, the means capable of changing an address connection between an external input address and a chip internal input address is a physical or electrical means.

In the above configuration, the means capable of changing an address connection between an external input address and a chip internal input address is an electrical means, and includes an address shift means for shifting, in response to a connection change made for a designated address, all addresses higher or lower than the designated address.

According to the above configuration, when a connection of a designated address is changed, the addresses higher or lower than the designated address are shifted; with this provision, it becomes possible to shift the connections starting from the designated address, thus making it easier to change the row/column mapping in the address space.

In the above configuration, the means capable of changing an address connection between an external input address and a chip internal input address is an electrical means, and includes an address shift means for shifting the address connection to a higher order position or a lower order position until a desired connection is established between the external input address and the chip internal input address.

In the above configuration, the means capable of changing an address connection between an external input address and a chip internal input address is an electrical means, and is constructed from a switch that is controlled by a signal.

In the above configuration, an external or internal signal capable of recognizing a difference in memory space is used to control the signal for controlling the switch.

In the above configuration, the address shift means includes means for fixing the chip internal input address to a high or a low level when the chip internal input address is disconnected from the external input address.

The present invention also provides a semiconductor memory device comprising: a plurality of RAMs of differing memory spaces provided on the same substrate; means for applying the same mapping to the differing memory spaces when simultaneously testing the plurality of RAMs; and means for inhibiting access to each individual RAM according to the differing memory spaces.

According to the above configuration, when the same row/column mapping is applied to the differing memory spaces, if access occurs to a virtual memory space, a series of memory operations are inhibited; this avoids the prior art problem that, even when access occurs to the virtual memory space, memory access operations are performed, resulting in unintended rewriting of memory data.

The present invention further provides a method for testing an address non-multiplexed semiconductor memory device having a plurality of RAMs of differing memory spaces on the same substrate, wherein all of the RAMs are tested simultaneously by setting the number of address signals in each of the RAMs equal to the number of address signals in the largest address space.

DESCRIPTION OF THE PREFERRED EMBODIMENTS

Embodiments of the present invention will be described below with reference to the drawings.

Figure 1:
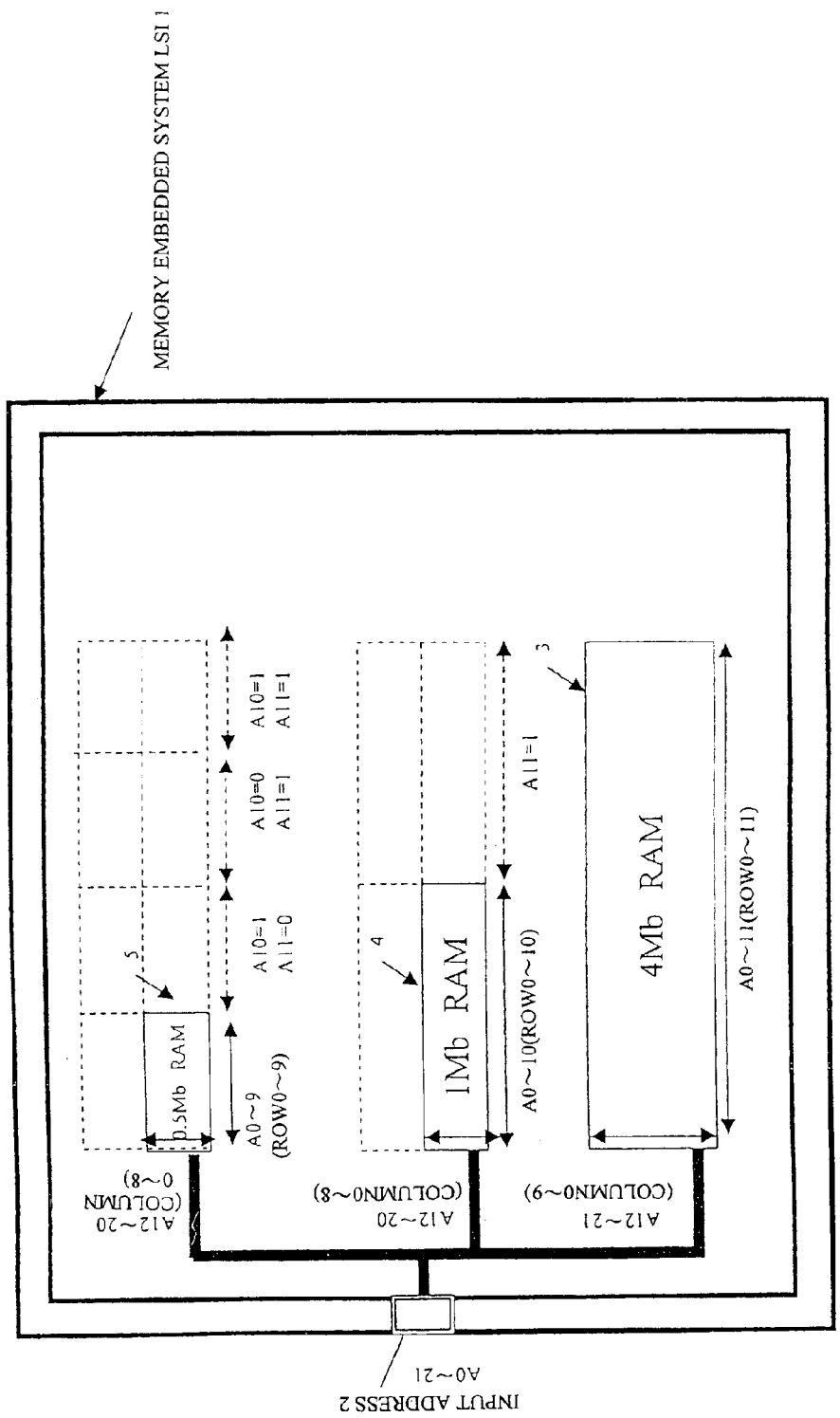
FIG. 1 is a block diagram of a semiconductor integrated circuit according to a first embodiment of the present invention.

FIG. 1 is a diagram schematically illustrating a first embodiment of the present invention. Reference numeral 1 is a memory embedded system LSI with memories embedded therein, and 2 is an input address A0–21 to RAMs employing a non-multiplexed addressing scheme that does not multiplex addresses. The non-multiplexed addressing scheme is a method that executes only an address signal in one cycle and is used for SRAMs, etc. Reference numeral 3 is an address non-multiplexed RAM with a memory capacity of 4 Mb that uses a total of 22 address bits, of which 12 bits are assigned to A0–11 on the row side and 10 bits to A12–21 on the column side; 4 is an address non-multiplexed RAM with a memory capacity of 1 Mb that uses 20 address bits, of which 11 bits are assigned to A0–10 on the row side and 9 bits to A12–20 on the column side; and 5 is an address non-multiplexed RAM with a memory capacity of 0.5 Mb that uses 19 address bits, of which 10 bits are assigned to A0–9 on the row side and 9 bits to A12–20 on the column side.

That is, the semiconductor memory device shown here employs the non-multiplexed addressing scheme, and comprises the plurality of RAMs 3 to 5 of differing memory spaces on the same substrate, plus a means for setting the number of address signals in each of the RAMs 3 to 5 equal to the number of address signals in the largest address space.

More specifically, an external address signal and a test-only address signal are provided as RAM control signals and, for the test-only address signal, the number of X, Y addresses in each of the RAMs 4 and 5 is set equal to that in the largest capacity RAM 3, thereby making the X, Y address mapping the same for all the RAMs 3 to 5.

As for the test method, all the RAMs 3 to 5 are tested simultaneously.

With the above arrangement, the row/column address mapping can be made the same for all the RAMs. Assume here that a scan test pattern for performing read/write operations by first incrementing in the row direction and then incrementing in the column direction in synchronism with the addressing of the three 4-Mb RAMs having the largest address space is applied simultaneously to the 4-Mb, 1-Mb, and 0.5-Mb RAMs; in this case, when accessing an address space of A10=1, since A10 is not assigned in the address space of the 0.5-Mb RAM, an address space of A10=0 is accessed a second time in the 0.5-Mb RAM. Likewise, in the case of A11=1, an address space of A11=0 is accessed in the 1-Mb and 0.5-Mb RAMs; therefore, data destruction or the like does not occur.

In this way, with the above arrangement, RAMs of different capacities can be tested in parallel fashion using an ordinary scan pattern; as a result, the RAMs can be tested using the same test pattern. In the prior art, the test time has increased with the number of groups classified by capacity but, by testing all the RAMs simultaneously as described above, a test flow independent of the number of capacity groups can be provided, and the effect of reducing the test time can thus be enhanced.

Figure 2:
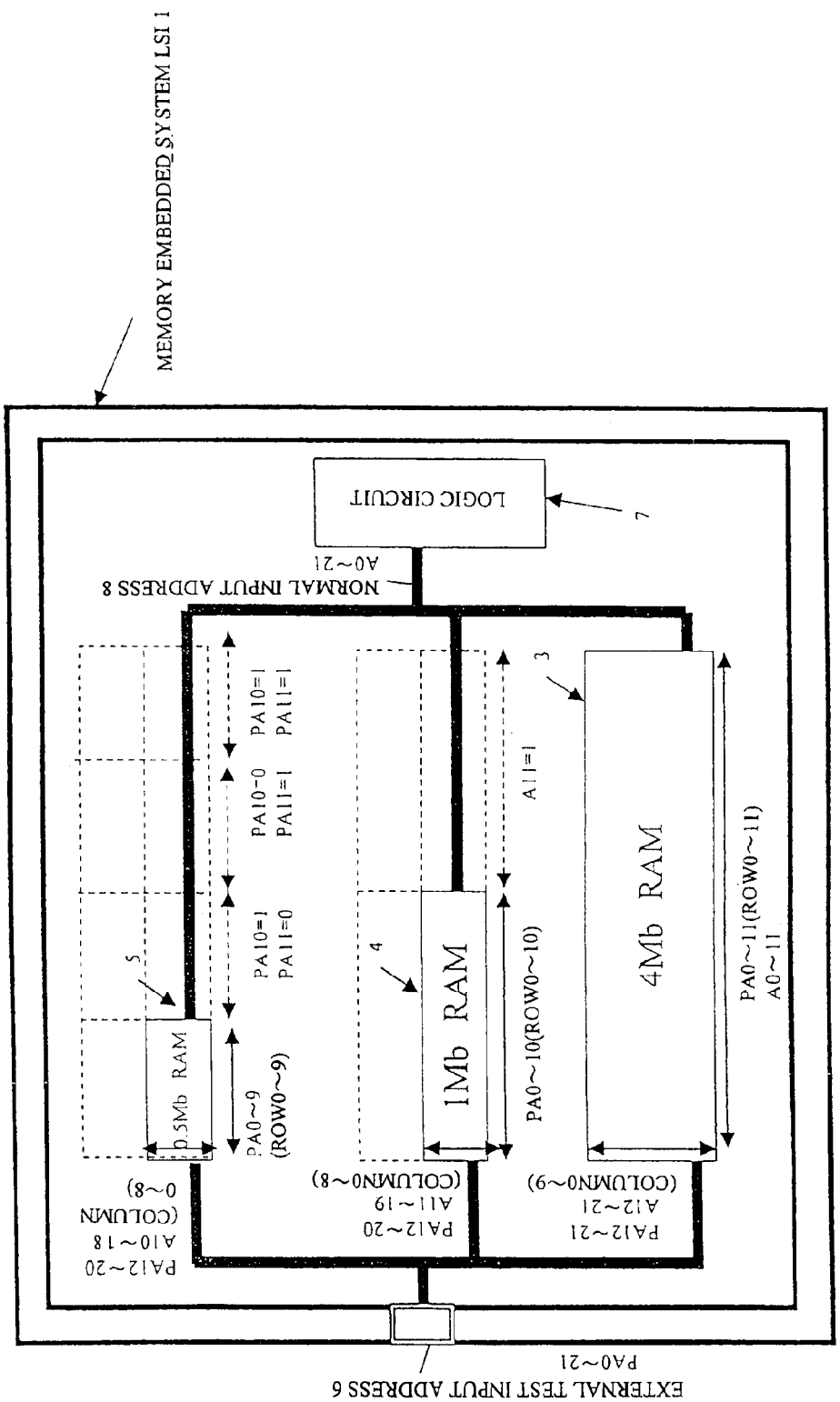
FIG. 2 is a block diagram of a semiconductor integrated circuit according to a second embodiment of the present invention.

FIG. 2 is a diagram schematically illustrating a second embodiment of the present invention. Reference numeral 1 is a memory embedded system LSI with memories embedded therein; 6 is an external test input address PA0–21 to RAMs employing a non-multiplexer scheme; 7 is a logic circuit which transfers data to and from the respective RAMs; 8 is a normal input address A0–21 to the non-multiplexer type RAMs for the logic circuit 7 to access the respective RAMs; 3 is an address non-multiplexed RAM with a memory capacity of 4 Mb that uses a total of 22 address bits, of which 12 bits are assigned to A0–11 on the row side and 10 bits to A12–21 on the column side in the case of the normal address, while in the case of the test address, 12 bits are assigned to PA0–11 on the row side and 10 bits to PA12–21 on the column side; 4 is an address non-multiplexed RAM with a memory capacity of 1 Mb in which, of the 20 test address bits, 11 bits are assigned to PA0–10 on the row side and 9 bits to PA12–20 on the column side, as in the first embodiment, and of the 20 normal address bits, 11 bits are assigned to A0–10 on the row side and 9 bits to A11–19 on the column side; and 5 is an address non-multiplexed RAM with a memory capacity of 0.5 Mb in which, of the 19 test address bits, 10 bits are assigned to PA0–9 on the row side and 9 bits to PA12–20 on the column side, as in the first embodiment, and of the 19 normal address bits, 10 bits are assigned to A0–9 on the row side and 9 bits to A10–18 on the column side.

That is, the semiconductor memory device shown here employs the non-multiplexed addressing scheme, and comprises the plurality of RAMs 3 to 5 of differing memory spaces on the same substrate, plus a means for setting the number of address signals in each of the RAMs 3 to 5 equal to the number of address signals in the largest address space when mapping the address space for test purposes differently from the mapping of the address space for normal operation.

With the above configuration, parallel testing of the respective macros can be performed at the time of testing. On the other hand, during normal operation, RAM accesses by the logic circuit 7 can be performed using contiguous address signals; therefore, the test time can be reduced without impairing the usability of the RAMs.

Figure 3:
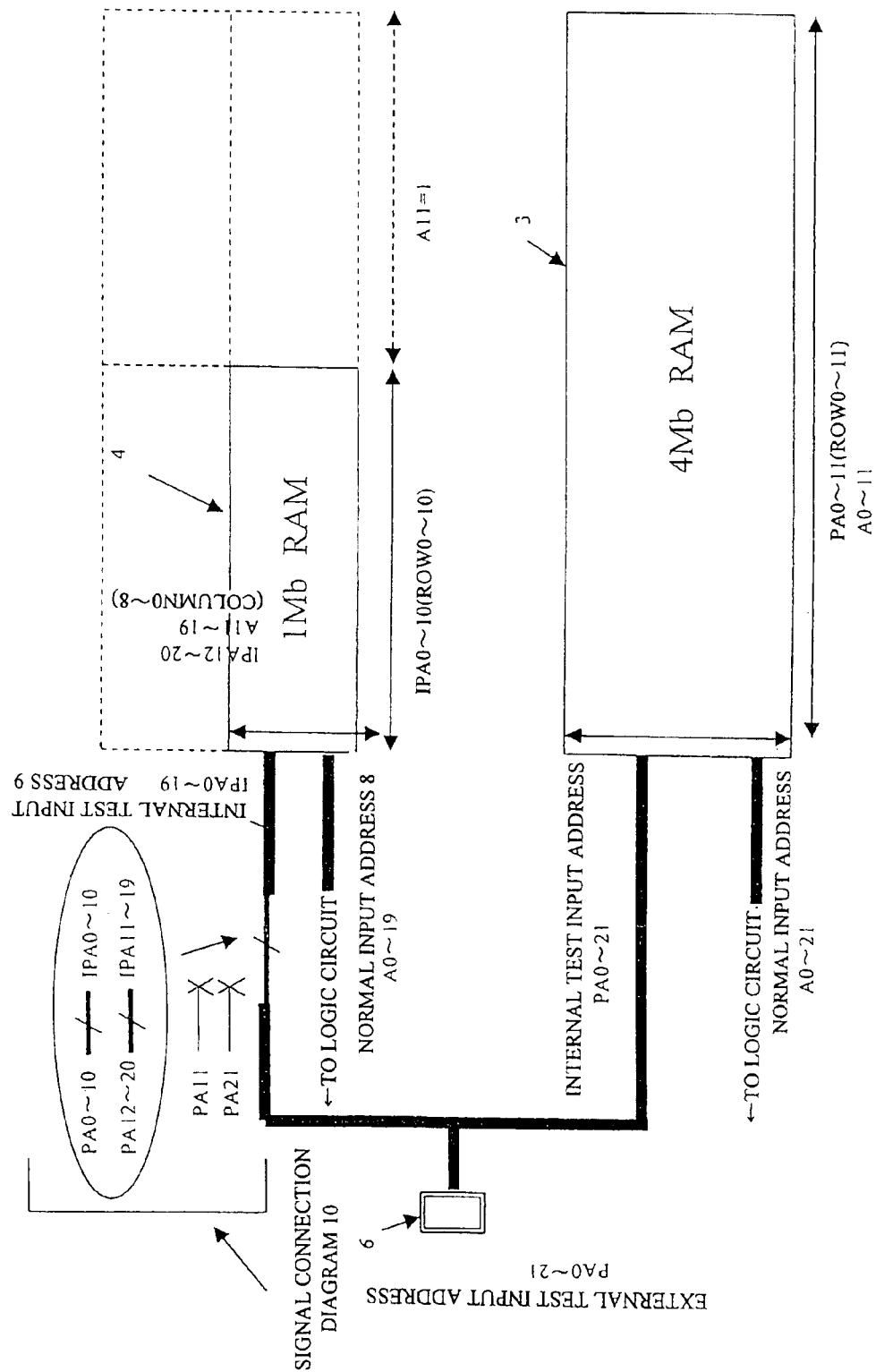
FIG. 3 is a block diagram showing an essential portion of a semiconductor integrated circuit according to a third embodiment of the present invention.

FIG. 3 is a diagram schematically illustrating a third embodiment of the present invention, wherein reference numeral 4 is an address non-multiplexed RAM with a memory capacity of 1 Mb in which, of the 20 bits in the internal test input address 9 (IPA0–19), 11 bits are assigned to IPA0–10 on the row side and 9 bits to IPA12–20 on the column side, the address thus being contiguous, and of the 20 bits in the normal address, 11 bits are assigned to A0–10 on the row side and 9 bits to A11 to 19 on the column side. Reference numeral 6 is an external test input address PA0–21, and 10 is a diagram showing the connection relationship between the internal test input address 9 and the external test input address 6, in which PA0–PA10 are connected to IPA0–10, PA11 is not connected, PA12–20 are connected to IPA11–19, and PA21 is not connected.

Otherwise, the configuration including that of the RAM 3 is the same as the configuration shown in the second embodiment. That is, the semiconductor memory device shown here employs the non-multiplexed addressing scheme, and comprises the plurality of RAMs 3 to 5 of differing memory spaces on the same substrate, plus a means capable of changing the address connection between the external input address and the chip internal input address according to the differing memory spaces; with the provision of this means, it becomes possible to set the number of address signals in each of the RAMs 3 to 5 equal to the number of address signals in the largest address space. The changing means is placed before the position at which the external input address signal is converted to the internal address signal.

With the above configuration, the number of address terminals for the internal test input address 9 can be made the same as that for the normal input address 8 by changing the address connection outside the RAMs 3 to 5, and the address mapping that makes parallel testing possible can thus be achieved without increasing the complexity of RAM circuit designs.

Figure 4:
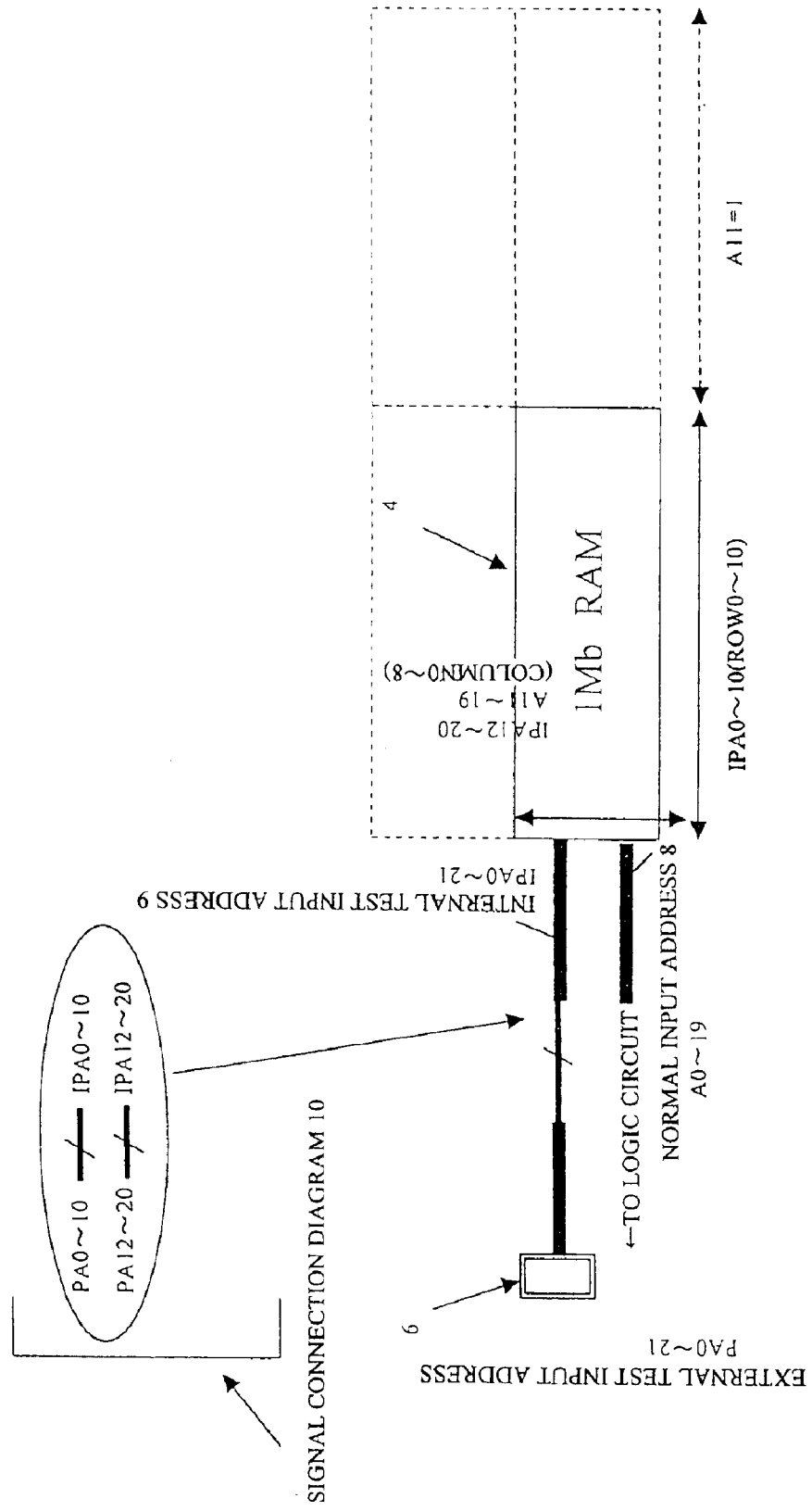
FIG. 4 is a block diagram showing an essential portion of a semiconductor integrated circuit according to a fourth embodiment of the present invention.

FIG. 4 is a diagram schematically illustrating a fourth embodiment of the present invention, which is fundamentally the same as the third embodiment that modifies a portion of the second embodiment; the difference is that the changing means capable of changing the address connection between the external input address and the chip internal input address is placed after the position at which the external input address signal is converted to the internal address signal.

Reference numeral 4 is an address non-multiplexed RAM with a memory capacity of 1 Mb in which the number of test addresses is different from the number of normal addresses, that is, the internal test input address 9 consists of 22 bits of IPA0–21 and the normal address consists of 20 bits of A0–19, and reference numeral 6 is the external test input address PA0–21.

In the above configuration, since the number of address bits for the external test input address 6 is the same as that for the internal test input address 9, the external test input address 6 can be connected to the internal test input address 9 in a one-to-one corresponding relationship.

Figure 5:
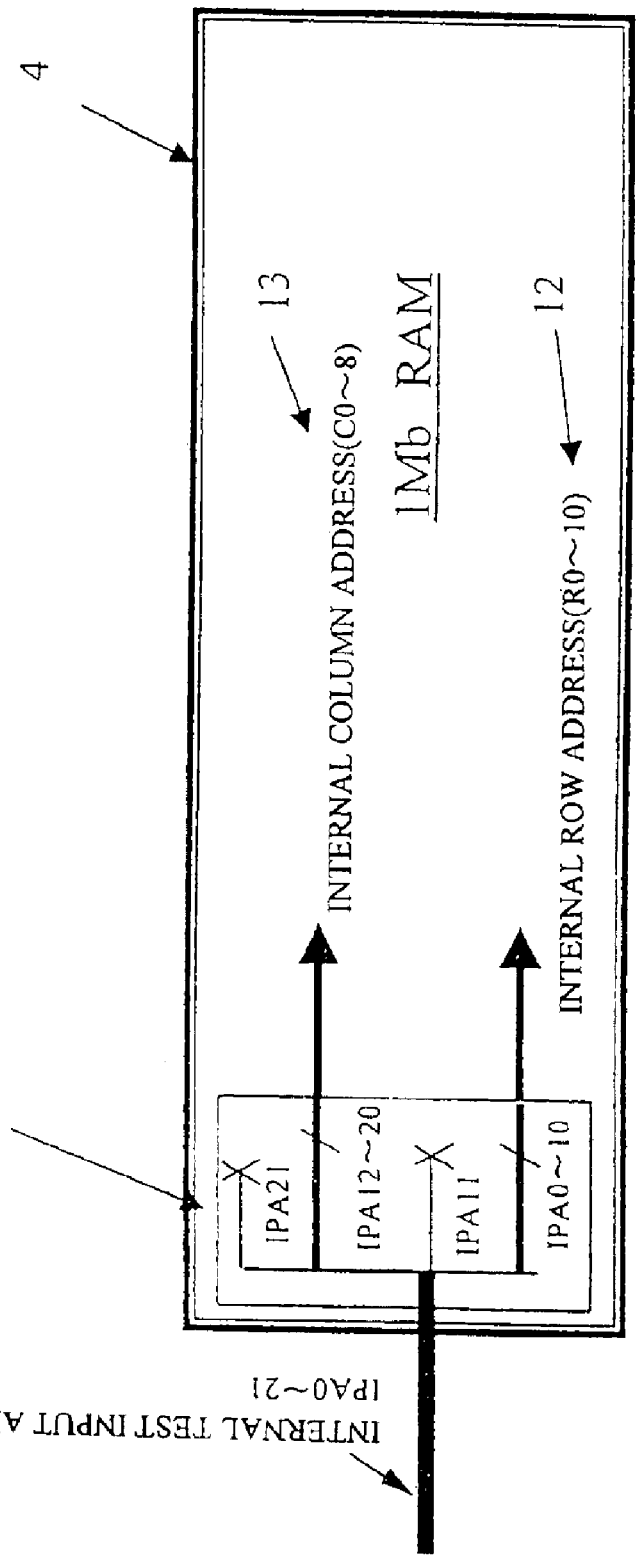
FIG. 5 is a diagram for explaining an address signal connection in the fourth embodiment of the present invention.

FIG. 5 shows one example of the configuration in which the number of address bits for the internal test input address 9 is made equal to that for the external test input address.

Reference numeral 11 is an address signal connection changing means for changing the connection between the internal test input address 9 (IPA0–21) and the internal row address 12 and internal column address 13, and 4 is a 1-Mb RAM whose internal row address 12, R0–10, is controlled by the internal test input address IPA0–10, and whose internal column address 13, C0–8, is controlled by the internal test input address IPA12–20.

In the case of the above RAM address configuration, IPA11 and IPA21 in the internal test input address are not used for the RAM address control. Therefore, IPA11 and IPA21 in the internal test input address are disabled by the address signal connection changing means 11. In this way, the number of address bits for the internal test input address 9 can be made equal to that for the external test input address 6.

Figure 6:
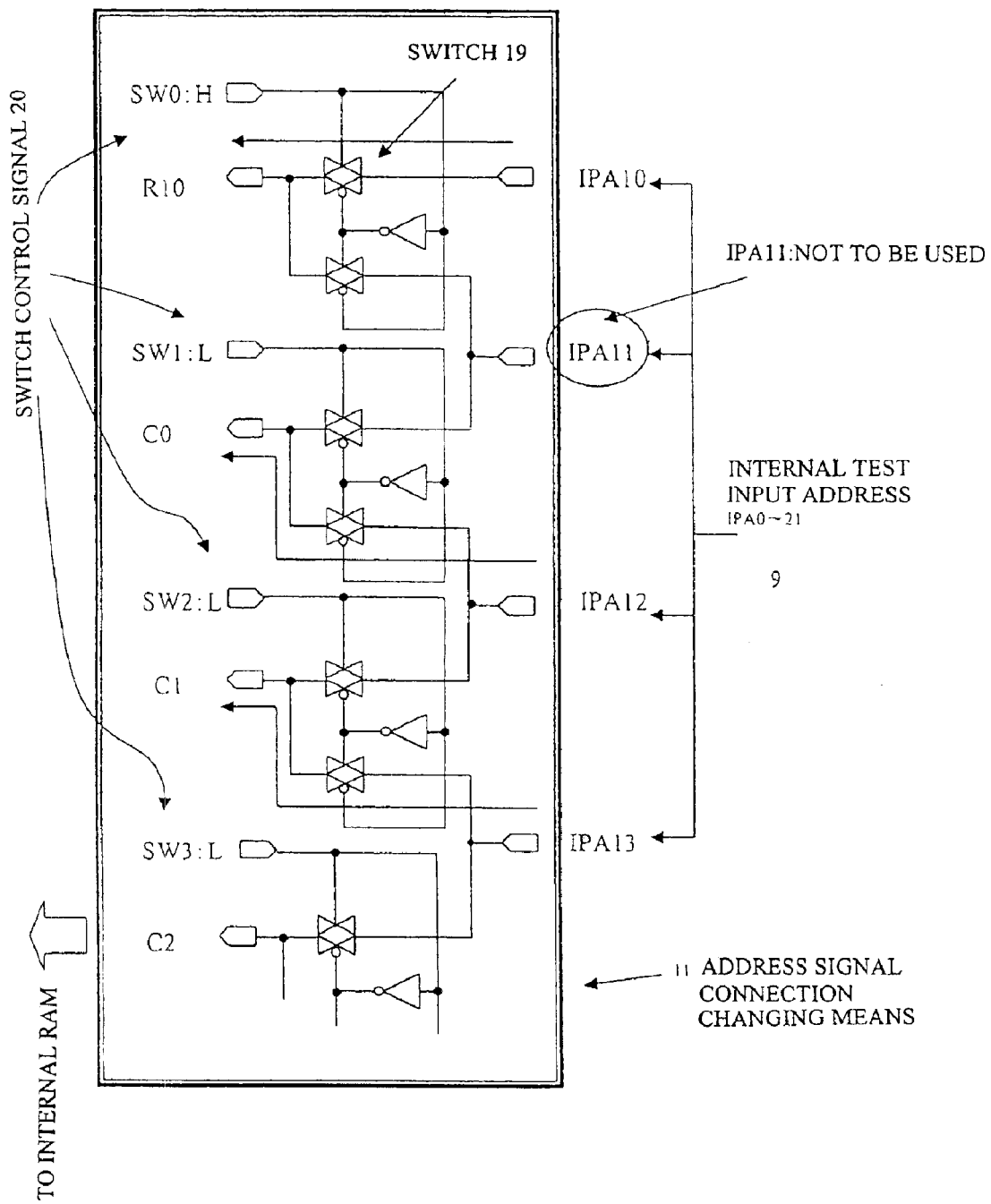
FIG. 6 is a circuit diagram of an address signal connection changing means in the fourth embodiment of the present invention.

FIG. 6 shows a specific example of how the address signal connection changing means 11 is implemented, wherein reference numeral 9 is the internal test input address IPA0–21, 11 is the address signal connection changing means for changing the connection between the internal test input address 9 and the internal row address 12 and internal column address 13, and 19 designates switches for electrically switching signals; as shown, IPA0–21 in the internal test input address are each connected via a pair of switches 19 to a corresponding one of adjacent bits in the internal column address C0–C8 and the internal row address R0–R10. Reference numeral 20 indicates switch control signals for controlling the switches 19, and an inverter for applying an inverted signal is provided between the switches 19 in each pair.

In the above configuration, consider the case where IPA11 in the internal test input address is put in a disabled state. Signals SW0: H, SW1: L, SW2: L, and SW3: L are input as the switch control signals 20 in order to disable the internal test input address IPA11. With the input of these signals, the internal test input address IPA10 is connected to the internal row address R10, the internal test input address IPA12 is connected to the internal column address C0, and the internal test input address IPA13 is connected to the internal column address C1. The internal test input address IPA11 is not connected to any address because the corresponding switches 19 are off.

Here, it will be easily understood that the input of the SW control signals 20 can be accomplished by physically connecting to VDD and VSS or by inputting the signals through logic circuits.

Figure 7:
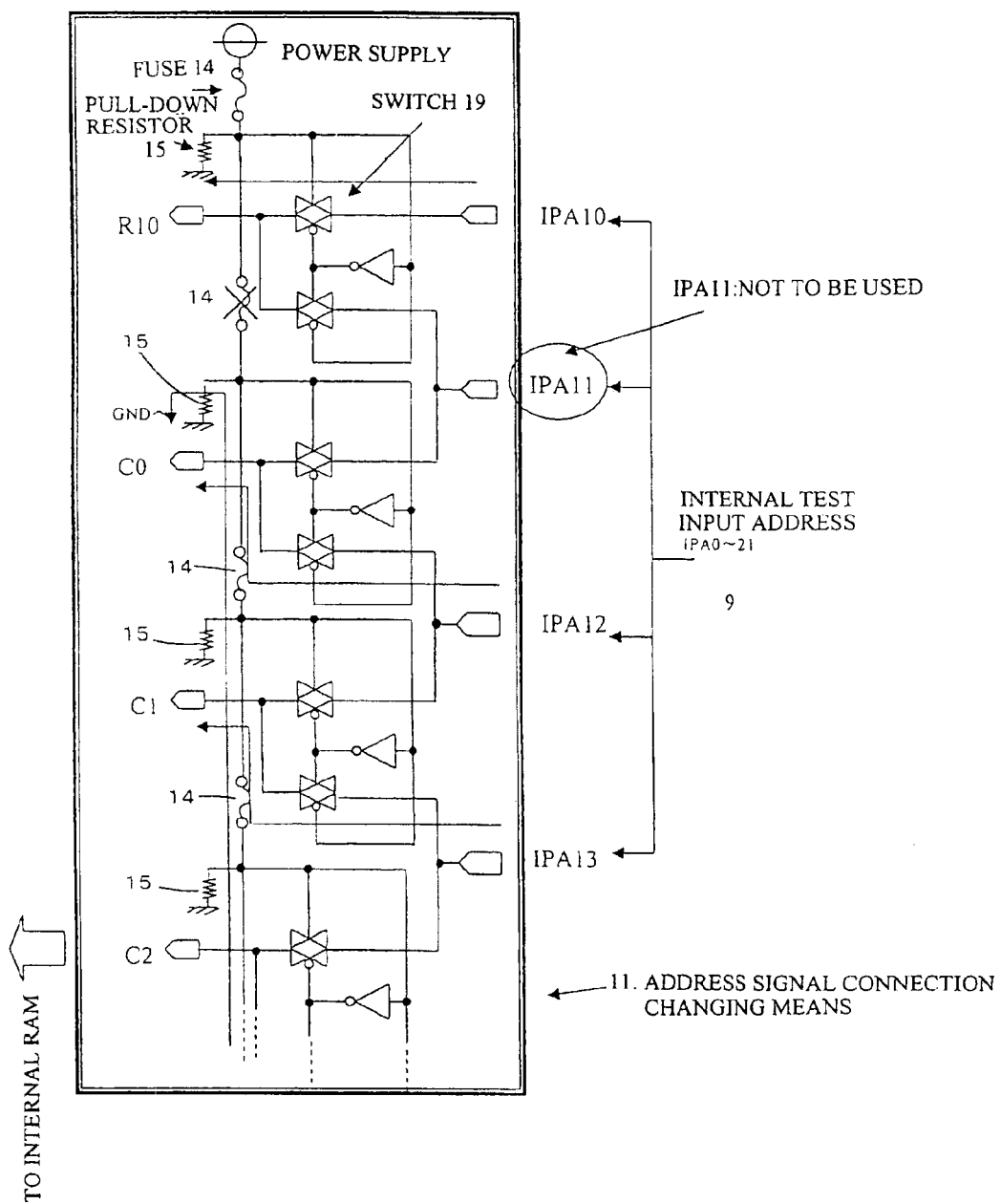
FIG. 7 is a circuit diagram of another address signal connection changing means in the fourth embodiment of the present invention.

FIG. 7 shows a second specific example of how the address signal connection changing means 11 is implemented, wherein reference numeral 9 is the internal test input addresses, 11 is the address signal connection changing means for changing the connection between the internal test input address 9 and the internal row address 12 and internal column address 13, 19 designates switches for electrically switching signals, 14 is a fuse whose electrical connection can be cut off by an external trimmer, and 15 is a pull-down resistor for fixing the node opposite from the power supply to GND when the fuse 14 is cut off.

In the above configuration, when a designated fuse 14 is cut off (for example, indicated by mark×), the pull-down resistor 15 corresponding to each fuse 14 disconnected from the power supply is enabled, and the connection is changed from the internal test input address 9 corresponding to each fuse 14 to the internal row and column address signals by sequentially shifting to higher order bits, thus accomplishing the same switch operating state as when the switch control signals 20 such as shown in FIG. 6 are applied. This eliminates the need to control the logic for each switch, and the desired address signal connection can be accomplished by just cutting the fuse 14 at the position where it is desired to change the connection. In DRAMs or the like, there are cases where a fuse 14 or an external signal or the like is used to change the memory cell refresh cycle according to the capacity. In the case of RAMs of such configuration, the address signal connection changing means 11 can be easily controlled by making use of, for example, a fuse node or an internal or external signal provided to recognize the capacity.

Figure 8:
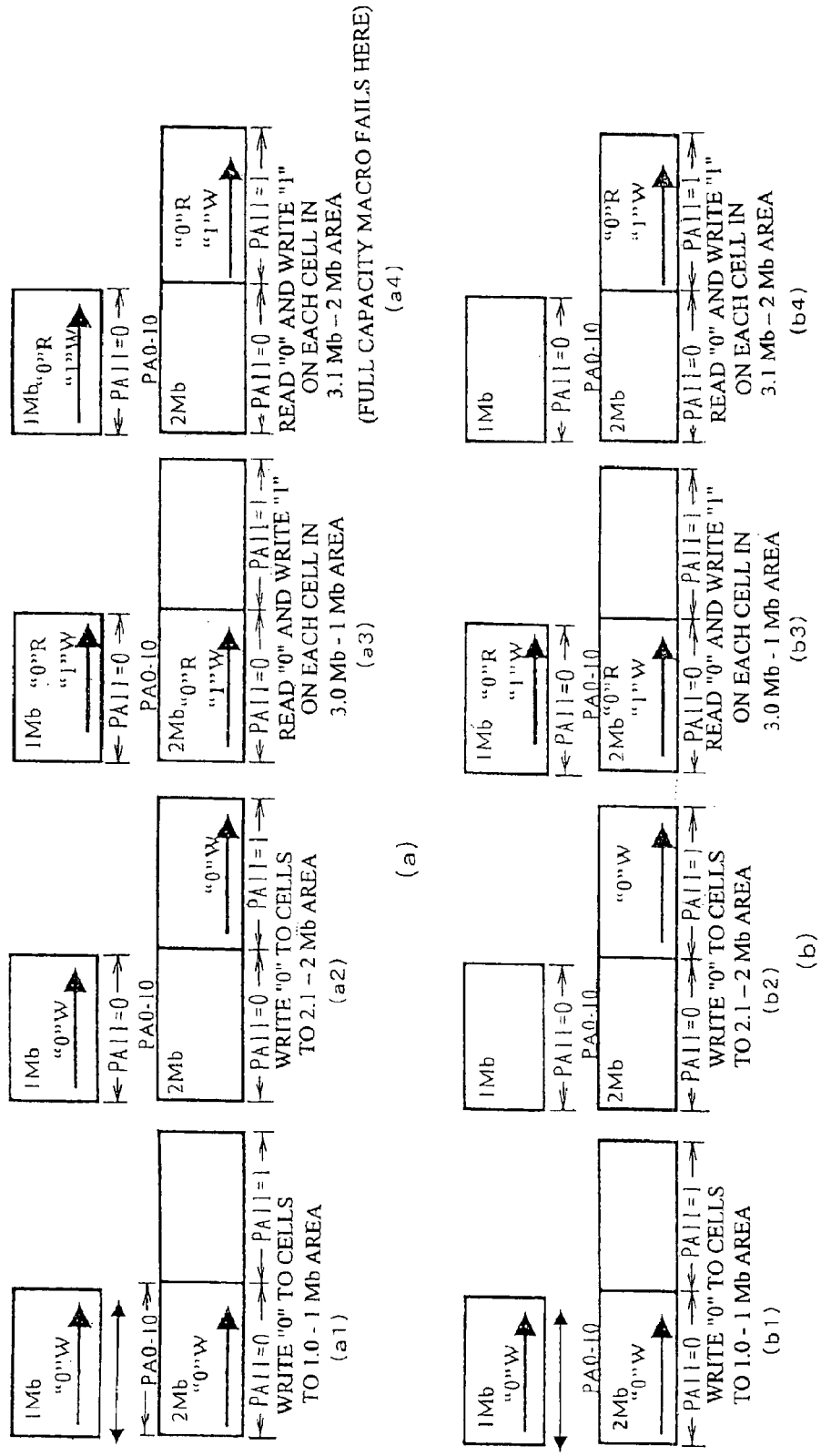
FIG. 8 is a diagram for explaining a test pattern in a fifth embodiment of the present invention.

FIG. 8 is a diagram showing a test pattern in a fifth embodiment of the present invention; in particular, FIGS. 8–1 illustrates the problem that occurs when simultaneously testing RAMs of differing capacities by using a test pattern. One of well known RAM patterns is a march pattern which is used to check addressing, etc. This pattern first writes data 0 in the entire RAM area, then reads data 0, writes data 1, and increments to the next and, after repeating this across the entire area, reads data 1 from the entire area; here, when the march pattern is applied to RAMs of different capacities 1 Mb and 2 Mb, data 0 are written in the entire area without any problem, but in the case of the 1-Mb RAM, when the data 0 read/data 1 write process proceeds beyond the 1-Mb capacity, the process returns to the starting address to repeat the data 0 read/data 1 write. Since the memory cell is already written with data 1, if the test is performed in this condition, the test cannot be done properly because the expected value does not match the actual data. That is, in FIG. 8, in the condition (a1) in FIG. 8(*a*), data "0" are written by incrementing the row address PA0–PA11 up to (0–7FF, hex). In both the 1-Mb RAM and 2-Mb RAM, the same address space is accessed. In the condition (a2), data "0" are written by incrementing the row address PA0–PA11 up to (800-FFF, hex). In the case of the 1-Mb RAM, since it does not have the address space of PA11=1, the space of PA0–PA11 (0–7FF, hex) is again accessed as in the condition (a1). On the other hand, in the case of the 2-Mb RAM, the space up to PA0–PA11 (800-FFF, hex) is accessed. In the condition (a3), data "0" is read from the attention memory cell and data "1" is written to the same cell. This operation is repeated up to the row address PA0–PA11 (0–7FF, hex) by incrementing in the row direction. With the operation in (a3), in both the 1-Mb RAM and 2-Mb RAM, the contents of the cells up to the address PA0–PA11 (800-FFF, hex) are changed from data "0" written by the operation in (a1) to data "1". In the condition (a4), the operation in (a3) is repeated up to the row address PA0–PA11 (800-FFF, hex). In the case of the 1-Mb RAM, the above operation is performed on exactly the same address space as that in the operation performed in (a3) since the RAM does not have the address space of PA11=1, as earlier described in connection with the operation in (a2). Here, in the 1-Mb RAM, data "0" is read as the expected value from the memory cell, but the data is already changed to "1" as a result of the operation in (a3). Since the expected value differs from the actual data, the test cannot be done correctly. This problem does not occur in the 2-Mb RAM.

In view of this, provision is made to inhibit access to the RAM when accessing the virtual memory address space. That is, in the above configuration, provision is made so as not to perform read/write operations when accessing the virtual memory address space, as shown in (b2) and (b4) in FIG. 8(*b*) corresponding to FIG. 8(*a*). With this provision, the march pattern can be executed properly. Furthermore, with almost all other memory test patterns, it becomes possible to simultaneously test RAMs of differing capacities.

Figure 9:
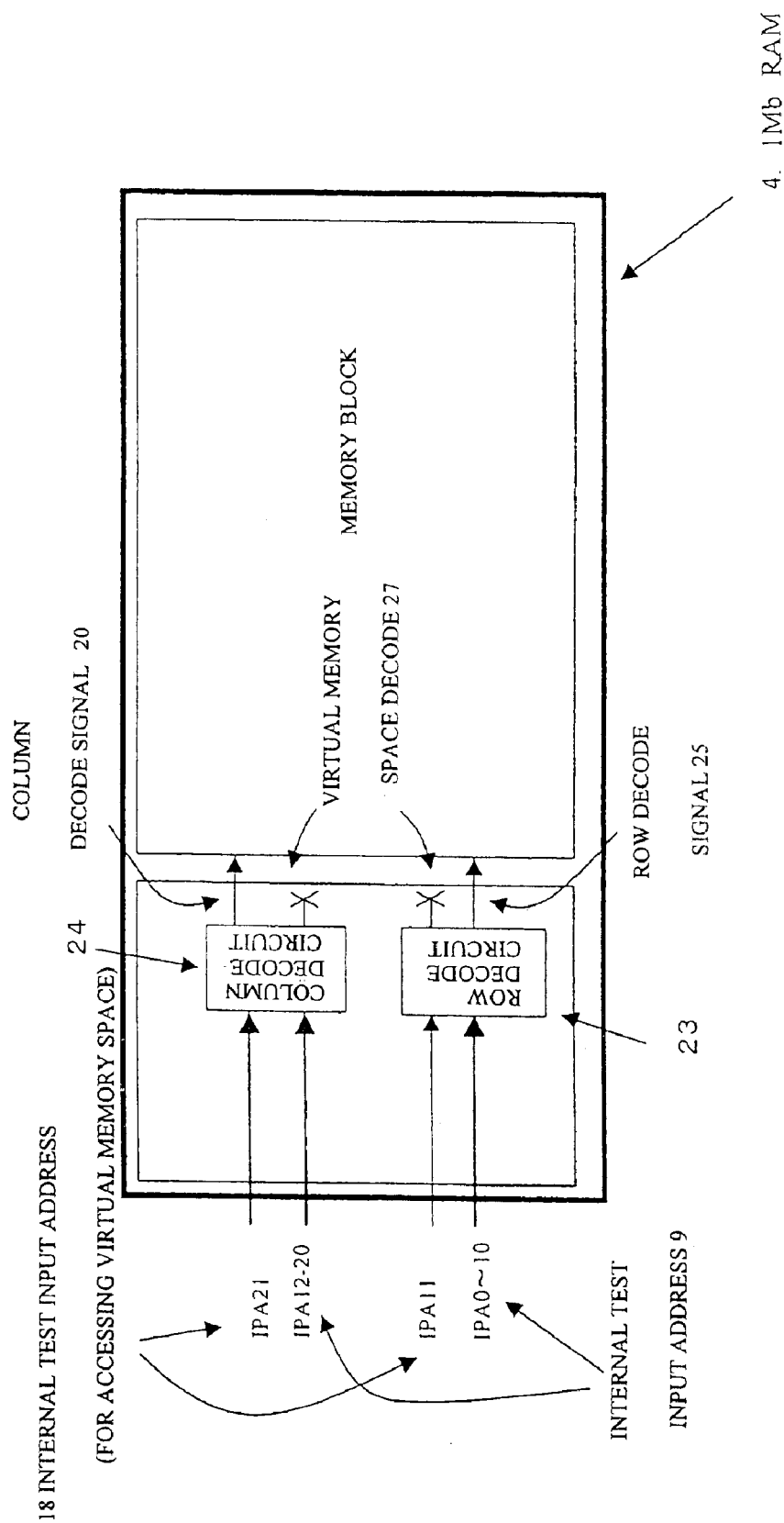
FIG. 9 is a block diagram of a semiconductor integrated circuit according to the fifth embodiment of the present invention.

FIG. 9 is a diagram showing one example of the configuration in the fifth embodiment of the invention in which access to the RAM is inhibited when the RAM is accessing the virtual memory address space. Reference numeral 4 is the 1-Mb RAM, 9 is the internal test input address IPA0–10 and 12–20, 18 is the internal test input address IPA11 and IPA 21 for accessing the virtual memory address space, 23 is a row decode circuit, 24 is a column decode circuit, 25 is a row decode signal decoded from the row address signal in the internal test input address, and 26 is a column decode signal decoded from the column address signal in the internal test input address; these decode signals are input to the memory block. Further, 27 is a virtual memory space decode signal decoded from the signal of the virtual memory space accessing address 18. The output of the virtual memory space decode signal 27 is open with respect to the memory block.

According to the above configuration, when accessing the virtual memory address space, the input address 18 for accessing the virtual memory address space is input. From this input signal, the row decode circuit 23 and the column decode circuit 24 generates the virtual memory space decode signal 27. The output of the virtual memory space decode signal 27 is not connected to anywhere. The configuration can thus be achieved that inhibits access to the internal RAM.

Otherwise, the configuration common to the first embodiment, etc. can be employed.

In FIG. 7, the address shift means may includes means for fixing the chip internal input address to a high or a low level when it is disconnected from the external input address.

The above embodiments have been described by taking the address non-multiplexed RAM as an example, but it will be appreciated that the invention is not limited to this particular example.

What is claimed is:

1. A semiconductor memory device comprising: a plurality of RAMs of differing memory space sizes on the same substrate; and means for setting the number of address signals in each of said plurality of RAMs equal to the number of address signals in the largest address space.

2. A semiconductor memory device comprising: a plurality of RAMs of differing memory space sizes on the same substrate; and means for setting the number of address signals in each of said plurality of RAMs equal to the number of address signals in the largest address space when mapping the address space for test purposes.

3. A semiconductor memory device comprising: a plurality of RAMs of differing memory space sizes provided on the same substrate; and means capable of changing an address connection between an external input address and a chip internal input address according to said differing memory spaces, wherein said means enables the number of address signals in each of said plurality of RAMs to be set equal to the number of address signals in the largest address space.

4. A semiconductor memory device as set forth in claim 3, wherein said means capable of changing an address connection between an external input address and a chip internal input address is placed before a position at which an external input address signal is converted to an internal address signal.

5. A semiconductor memory device as set forth in claim 3, wherein said means capable of changing an address connection between an external input address and a chip internal input address is placed after a position at which an external input address signal is converted to an internal address signal.

6. A semiconductor memory device as set forth in claim 3, wherein said means capable of changing an address connection between an external input address and a chip internal input address is a physical or electrical means.

7. A semiconductor memory device as set forth in claim 6, wherein said means capable of changing an address connection between an external input address and a chip internal input address is an electrical means, and includes an address shift means for shifting, in response to a connection change made for a designated address, all addresses higher or lower than said designated address.

8. A semiconductor memory device as set forth in claim 6, wherein said means capable of changing an address connection between an external input address and a chip internal input address is an electrical means, and includes an address shift means for shifting said address connection to a higher order position or a lower order position until a desired connection is established between said external input address and said chip internal input address.

9. A semiconductor memory device as set forth in claim 6, wherein said means capable of changing an address connection between an external input address and a chip internal input address is an electrical means, and is constructed from a switch that is controlled by a signal.

10. A semiconductor memory device as set forth in claim 9, wherein an external or internal signal capable of recognizing a difference in memory space is used to control said signal for controlling said switch.

11. A semiconductor memory device as set forth in claim 7 or 8, wherein said address shift means includes means for fixing said chip internal input address to a high or a low level when said chip internal input address is disconnected from said external input address.

12. A semiconductor memory device comprising: a plurality of RAMs of differing memory space sizes provided on the same substrate; means for applying the same mapping to said differing memory spaces when simultaneously testing said plurality of RAMs; and means for inhibiting access to each individual RAM according to said differing memory spaces.

13. A method for testing a semiconductor memory device having a plurality of RAMs of differing memory space sizes on the same substrate, wherein all of said RAMs are tested simultaneously by setting the number of address signals in each of said plurality of RAMs equal to the number of address signals in the largest address space.

* * * * *